United States Patent
Den et al.

(10) Patent No.: US 6,804,081 B2
(45) Date of Patent: Oct. 12, 2004

(54) STRUCTURE HAVING PORES AND ITS MANUFACTURING METHOD

(75) Inventors: Toru Den, Tokyo (JP); Nobuhiro Yasui, Kanagawa (JP); Tatsuya Saito, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 55 days.

(21) Appl. No.: 10/144,257

(22) Filed: May 10, 2002

(65) Prior Publication Data

US 2003/0001274 A1 Jan. 2, 2003

(30) Foreign Application Priority Data

May 11, 2001 (JP) ........................................ 2001-142049

(51) Int. Cl.[7] .............................................. G11B 17/00
(52) U.S. Cl. .................. 360/97.01; 428/65.3; 360/135; 360/131
(58) Field of Search ................................. 360/135, 131, 360/97.01; 428/65.3

(56) References Cited

U.S. PATENT DOCUMENTS

| | | | |
|---|---|---|---|
| 4,091,158 A | 5/1978 | Kasuga et al. | 428/216 |
| 4,109,287 A | 8/1978 | Kawai et al. | 360/131 |
| 5,623,386 A | 4/1997 | Sullivan | 360/135 |
| 5,850,329 A | 12/1998 | Sullivan | 360/135 |
| 5,923,511 A | 7/1999 | Bandara et al. | 360/135 |
| 6,464,853 B1 | 10/2002 | Iwasaki et al. | 205/118 |
| 6,541,386 B2 * | 4/2003 | Aiba et al. | 438/707 |
| 6,628,053 B1 | 9/2003 | Den et al. | 313/310 |
| 2002/0014621 A1 | 2/2002 | Den et al. | 257/3 |
| 2002/0086185 A1 | 7/2002 | Yasui et al. | 428/694 TS |
| 2003/0001150 A1 | 1/2003 | Iwasaki et al. | 257/3 |
| 2003/0197456 A1 | 10/2003 | Den et al. | 313/309 |

FOREIGN PATENT DOCUMENTS

| | | |
|---|---|---|
| JP | 58-188334 | 11/1983 |
| JP | 62-114121 | 5/1987 |
| JP | 11-224422 | 8/1999 |

OTHER PUBLICATIONS

Masuda, H., Solid State Physics, vol. 31, No. 5, 493–499 (1996).

Furneaux, et al., "The Formation of controlled–porosity ... aluminum", Nature, vol. 337, No. 6203, 147–149 (1989).

* cited by examiner

*Primary Examiner*—Roy Potter
(74) *Attorney, Agent, or Firm*—Fitzpatrick, Cella, Harper & Scinto

(57) ABSTRACT

A structure having pores includes a first layer containing alumina, a second layer that includes at least one of Ti, Zr, Hf, Nb, Ta, Mo, W and Si, and a third layer with electrical conductivity, in this order, wherein the first and second layers have pores.

19 Claims, 11 Drawing Sheets

Fig. 1 (A) (Prior Art)
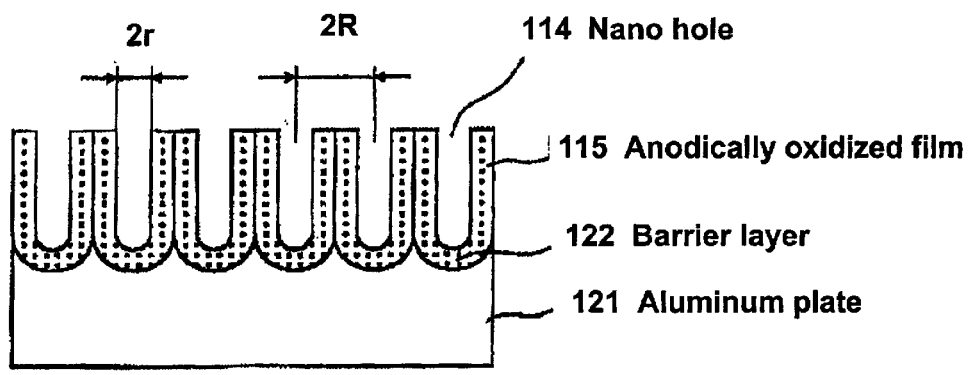
Fig. 1 (B) (Prior Art)
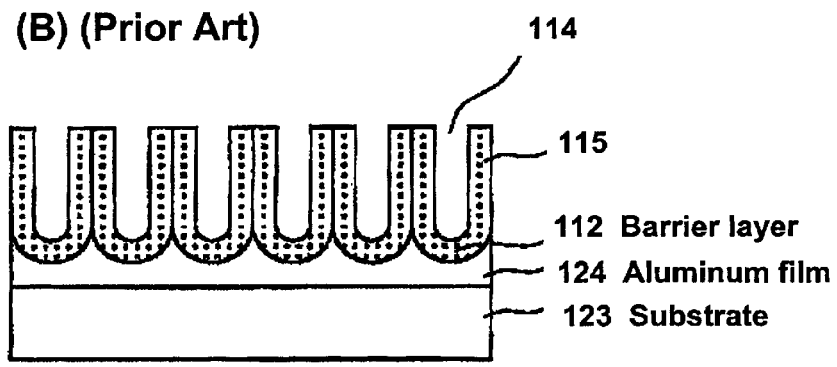

Fig. 2 (A) (Prior Art)
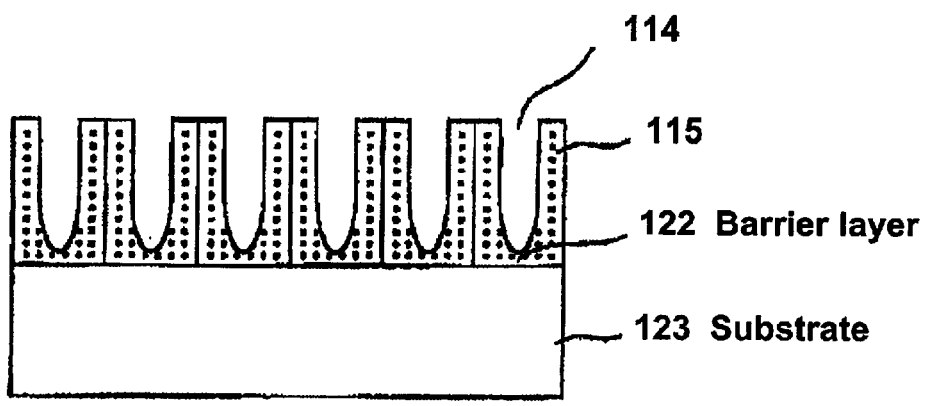
- 114
- 115
- 122 Barrier layer
- 123 Substrate
Fig. 2 (B) (Prior Art)
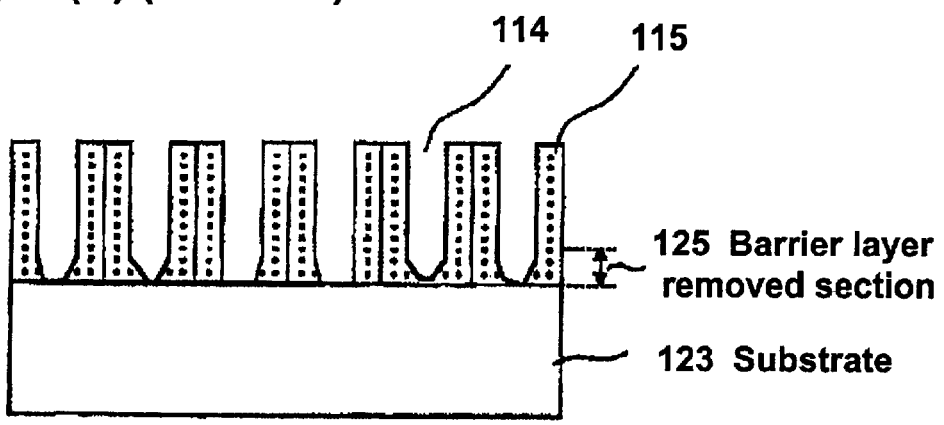
- 114
- 115
- 125 Barrier layer removed section
- 123 Substrate

STRUCTURE HAVING PORES AND ITS MANUFACTURING METHOD

BACKGROUND OF THE INVENTION

1. Field of the Invention

The present invention relates to a structure having pores and its manufacturing method. The structure having pores obtained through this invention has a wide area of application such as functional materials and structural materials for electronic devices, memory media and memory devices. More particularly, the structure with pores can be used in vertical magnetic recording media, solid-state magnetic memory, magnetic sensor and photonic device.

2. Related Background Art

While the present invention concerns structures with pores, it is applicable without depending on the hole diameter of the pores.

A technical background centering on nano-size structures will be explained here because of the heightened interest in recent years on nano-size (structures ranging in size from about 0.1 nm to 200 nm) structures having pores (hereafter, referred to as "nano structure").

Moreover, while there is no doubt that the reason nano structures have garnered interest is because of the anticipation of various effects due to their small sizes (for example in increasing the density of recording media), it is also because metals, thin-film semiconductors, fine wires and dots display unique electrical, optical and chemical properties as electron movements are sealed in sizes that are smaller than certain characteristic lengths.

Some of the manufacturing methods for nano structures include fine pattern drawing technology, such as photolithography, electron beam exposure and X-ray exposure that use semiconductor processing technology. Problems that have been pointed out in nano structure manufacturing methods using semiconductor processing technology include poor yield and the high cost of equipment. Thus, simple manufacturing methods with excellent reproductive qualities have been sought.

As a simple manufacturing method mentioned above, there is an attempt to realize a new nano structure based on a structure formed through self-organization, that is a systematic structure formed naturally. Many research projects are now under way for this technology because of the possibility of creating structures that are finer and more unique than those created through traditional methods, depending on the fine structure used as the base.

An example of a unique structure formed through self-organization is anodically oxidized alumina film (for example, see R. C. Furneaux, W. R. Rigby & A. P. Davidson "Nature" Vol. 337, P147 (1989)). The following is an explanation on the aforementioned positive pole oxide alumina film, using specific drawings.

FIGS. 1 and 2 schematically show cross-sectional views when anodically oxidized alumina nano holes are created on aluminum plates (or films). When an aluminum plate is anodically oxidized with acid electrolyte solution, a multi-pored oxidized film is formed. In FIG. 1(A), reference numeral 114 denotes a nano hole, reference numeral 115 denotes an anodically oxidized film, and reference numeral 122 denotes a barrier layer. Also, a barrier layer means an insulated region-comprising alumina that exists at the bottom surface of the pore section of anodically oxidized film 115.

FIG. 1(B) schematically shows a cross section of an aluminum (Al) film on the substrate that has been anodically oxidized mid way. In this figure, reference numeral 123 denotes a substrate, and reference numeral 124 denotes an aluminum film.

The characteristics of this multi-pored oxidized film are the fact that the fine and cylindrical nano holes (pores) 114 with extremely small diameters (2r) of several nm to several hundred nm, features a unique geometrical structure of aligning parallel at an interval of several tens nm to several hundred nm, as shown in FIG. 1(A).

Also, various applications are being attempted to utilize the uniquely geometrically structured anodically oxidized alumina nano holes.

For example, some applications concern the use of anodically oxidized films for their wear-resistance property or insulation-resistance properties. There is also an application of anodically oxidized films substance as filter after separating the films. Further, there are various attempts to develop technology to fill the nano hole with metal, semiconductor or magnetic material, or using the replica technology for coloring, magnetic recording media, EL light emitting devices, electro-chromic devices, optical devices, solar cells and gas sensors. There are many other anticipated application areas such as quantum fine wires, MIM devises and other quantum effect devices, and molecular sensors that use nano holes as the venue for chemical reaction. Moreover, a detailed description of nano hole is shown in Masuda "Solid State Logic" 31,493 (1996).

However, there were various limitations in the development of devices using the above-mentioned nano hole layers because, as shown in FIGS. 1(A) and 1(B), the conventional support material that comes in contact with anodically oxidized alumina hole layer is limited to aluminum plate 121 (or aluminum film 124).

SUMMARY OF THE INVENTION

Therefore, the present invention relates to a new structure that possesses the characteristics of support material for the pore layers that include alumina and its manufacturing method. More particularly, the present invention relates to a structural material using a substance other than aluminum for the aforementioned support material and its manufacturing method.

A structure having pores in accordance with an embodiment of the present invention has a first layer containing alumina, a second layer that has at least one of Ti, Zr, Hf, Nb, Ta, Mo, W or Si, and a third layer with electrical conductivity, in that order, wherein the first and second layers have pores.

Also, a manufacturing method of a structure having pores in accordance with an embodiment of the present invention includes the steps of preparing a first layer containing alumina, a second layer that has at least one of Ti, Zr, Hf, Nb, Ta, Mo, W or Si, and a third layer with electrical conductivity, in that order, anodically oxidizing the first layer and forming first pores in the first layer, and forming second pores in the second layer.

Other features and advantages of the invention will be apparent from the following detailed description, taken in conjunction with the accompanying drawings that illustrate, by way of example, various features of embodiments of the invention.

BRIEF DESCRIPTION OF THE DRAWINGS

FIG. 1(A) schematically shows a conventional structure with alumina nano holes.

FIG. 1(B) schematically shows a conventional structure with alumina nano holes.

FIG. 2(A) schematically shows a conventional structure with alumina nano holes.

FIG. 2(B) schematically shows a conventional structure with alumina nano holes.

DESCRIPTION OF THE PREFERRED EMBODIMENTS (The First Embodiment: Configuration of Structure Having Pores)

Structures in accordance with embodiments of the present invention will be explained with reference to the accompanying drawings.

Figure 3:
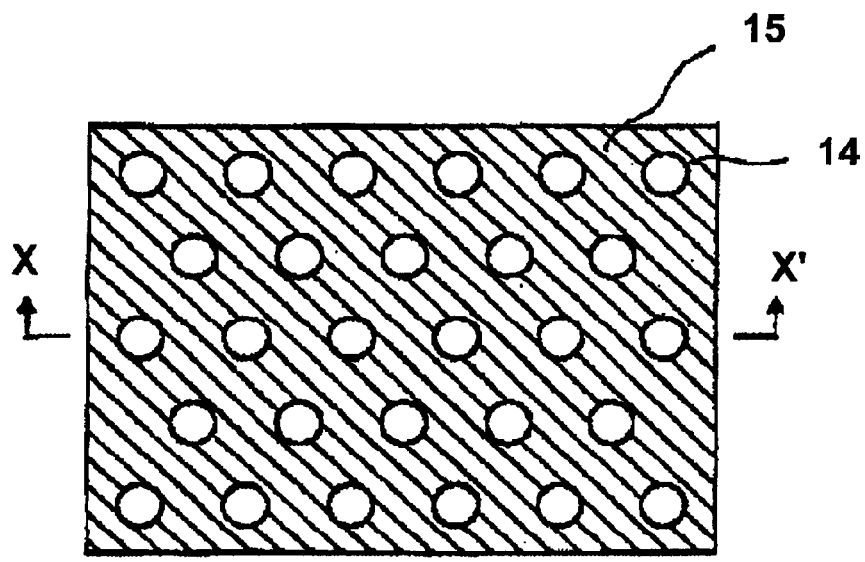
FIG. 3(A) schematically shows a plan view of a structure having pores in accordance with an embodiment of the present invention.
FIG. 3(B) schematically shows a cross section taken along lines X–X' in FIG. 3(A).
Figure 3:
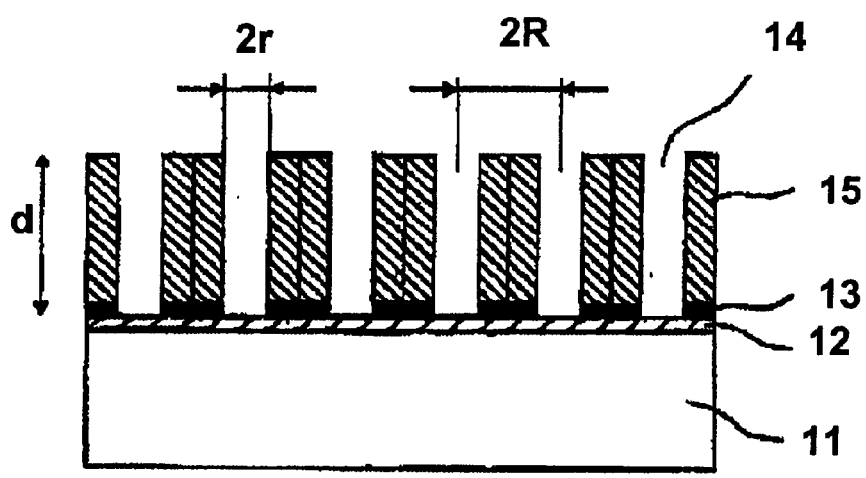

FIGS. 3(A) and 3(B) schematically show examples of the structures concerning the present invention.

FIG. 3(A) is a plan view of a structure having pores, and FIG. 3(B) shows a cross section taken along lines X–X' in FIG. 3(A). The structure having pores shown in these figures has a substrate 11, a first layer 15 containing alumina, pores 14, a second layer 13 containing at least one of Ti, Zr, Hf, Nb, Ta, Mo, W or Si, and a third layer 12 with electrical conductivity. In one aspect of the present embodiment, the first and second layers both have pores, and these pores are connected. This structure makes it possible to use materials other than aluminum as the parts material (the aforementioned second and third layers) to support the first layer that contains alumina. The materials other than aluminum include material that does not contain aluminum as the main ingredient. Main ingredient means the main elements that comprise the above material, and may include the composition element whose atomic weight ratio of the aforementioned material is 20% or more when analyzed using ICP, for example.

Moreover, in this invention, the pores penetrate the first and second layers, with the electrically conductive third layer exposed to the bottom portion of the pores. Therefore, the pores can be filled with the required material through electrodeposition. The hole diameter of pores in the present invention structure shall not be limited to specific values, but it may be between about 0.1 nm to 500 nm, preferably from about 0.1 nm to 200 nm. Hereafter, the words "nano hole" may be used in place of structures with porous. Moreover, while the length of the pores will not be restricted, they can be set, for example, between several nm to several tens of micrometer. The following shall be a description of the aforementioned first, second and third layers.

The first layer is, for example, a layer obtained by anodically oxidizing material containing aluminum as a composition element. When the parts material is aluminum, the first layer may be an alumina layer (or, alumina nano hole layer). Naturally, the parts material may contain other elements if it has aluminum as its main composition ingredient. Main ingredient means the main element that comprises the parts material. For example, when analyzed using ICP or other analyzer, the atomic weight ratio of the ingredient may be 20% or more in the aforementioned parts material. The thickness of the first layer is not restricted, but it can be suitably set within a range of several nm to several tens $\mu$m.

The second layer is a layer obtained by anodically oxidizing material containing at least one of Ti, Zr, Hf, Nb, Ta, Mo, W and Si, like in the case of the first layer.

The material mentioned above may be metal, semiconductor or alloy. Also, if the material is processed by anodic oxidation and becomes oxidized, such as oxidized tungsten (W), this would be desirable. According to the inventors' study, it is found that the second layer enhances the bonding strength between the first and third layers. While the details are unknown, the cause of this strengthening may be the result of the anodic oxidation processing of the second layer similar to the first layer. Because of this, the second layer is often referred to as the bonding layer.

While the thickness of the second layer is not particularly limited, it may be within 1 nm to 100 nm, and preferably 1 nm to 50 nm.

Also, the thickness of the second layer may preferably be thinner than that of the third layer. More preferably, the thickness of the second layer may be thinner than half the thickness of the third layer. Also, the thickness of the second layer may be thinner than the thickness for the first and third layers.

Figure 4:
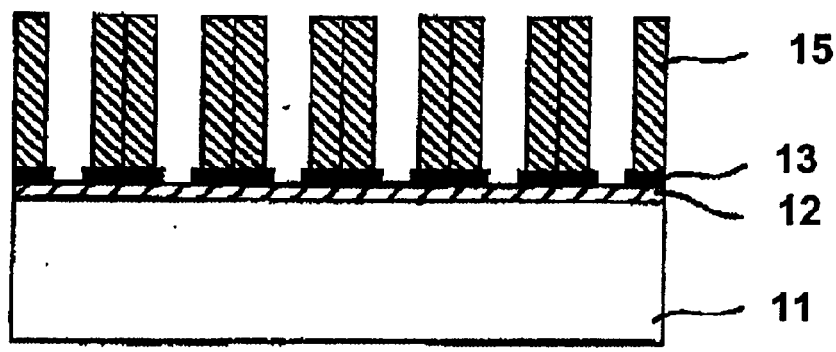
FIG. 4(A) schematically shows a cross section of a structure having pores in accordance with an embodiment of the present invention.
FIG. 4(B) schematically shows a cross section of a structure having pores in accordance with an embodiment of the present invention.
Figure 4:
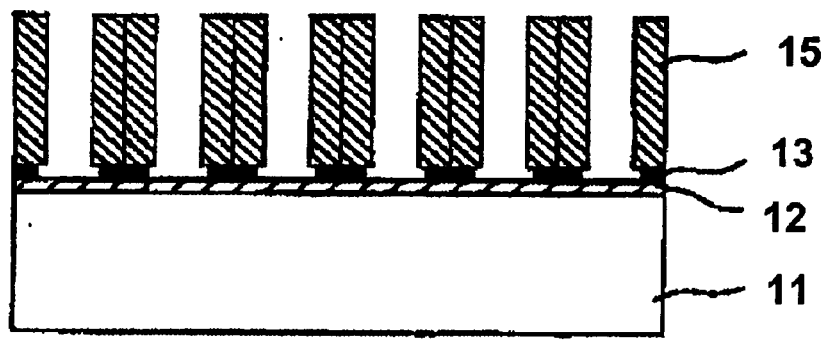

In the present invention, the first and second layers both have pores formed through the anodic oxidation process, the pores for the first and second layers may preferably have different hole diameters, as shown in FIGS. 4(A) and 4(B), for example.

The third layer may consist of Cu, precious metal, alloys containing Cu, alloys containing precious metal or semiconductor material. Precious metals here are selected from Ag, Au, Pt, Pd, Ir, Rh, Os or Ru. The semiconductor material may include, for example, graphite, Si, InP, GaAs, GaN, SiGe, or Ge. When metal is used as the material for the third layer, the third layer could be expressed as an electrically conductive metal base layer. The third layer may be thin film or the substrate itself. In other words, a conductive material may be selected as the substrate 11 itself without using the third layer 12 in FIG. 3(B). In this case if some element is to be filled into the pores, it is recommended that Cu or Pt be included in the conductive metal base layer.

As for the substrate 11 in FIG. 3(B), a quartz substrate, a glass substrate, a metal substrate or a semiconductor substrate can be used. Naturally, plastics, poly ethylene terephthalate (PET), polyimide and other flexible films can also be used as the substrate.

Moreover, the structure explained above can be used as a mask or a mold.

(Second Embodiment: Manufacturing Method of Structures with Porous.)

Figure 5:
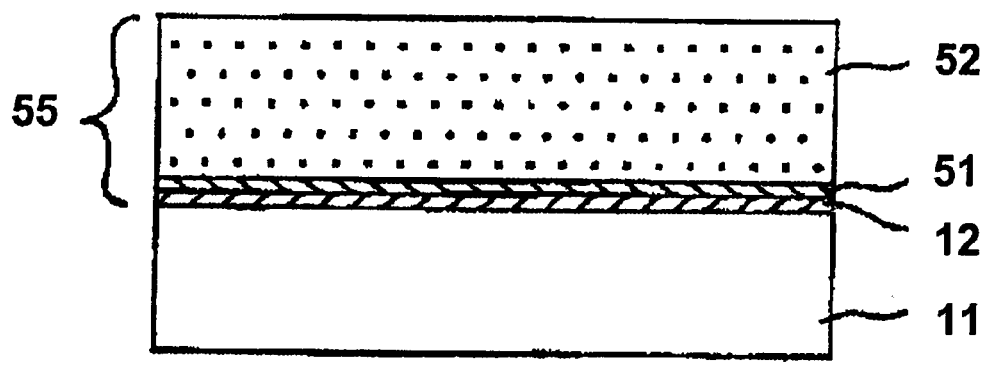
FIGS. 5(A)–5(C) schematically show a process of manufacturing a structure having pores in accordance with an embodiment of the present invention.
Figure 5:
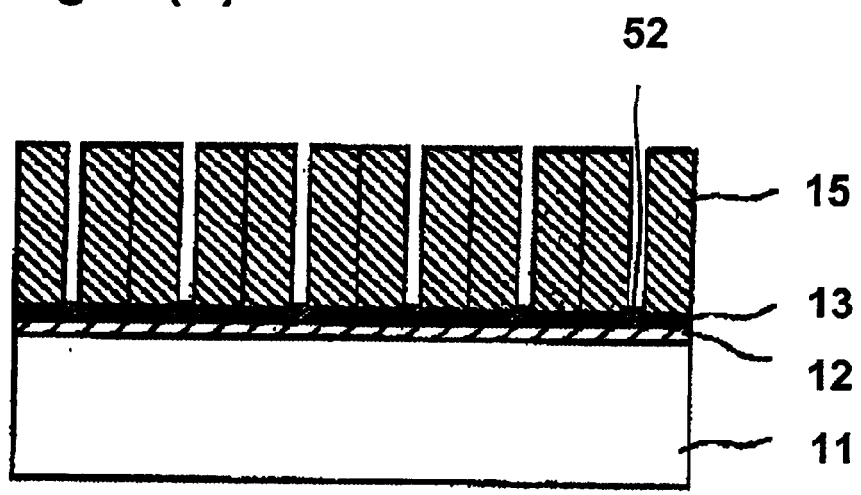
Figure 5:
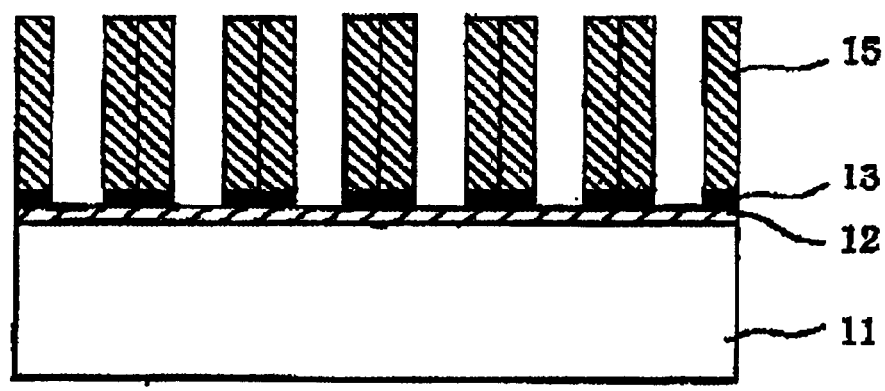
Figure 6:
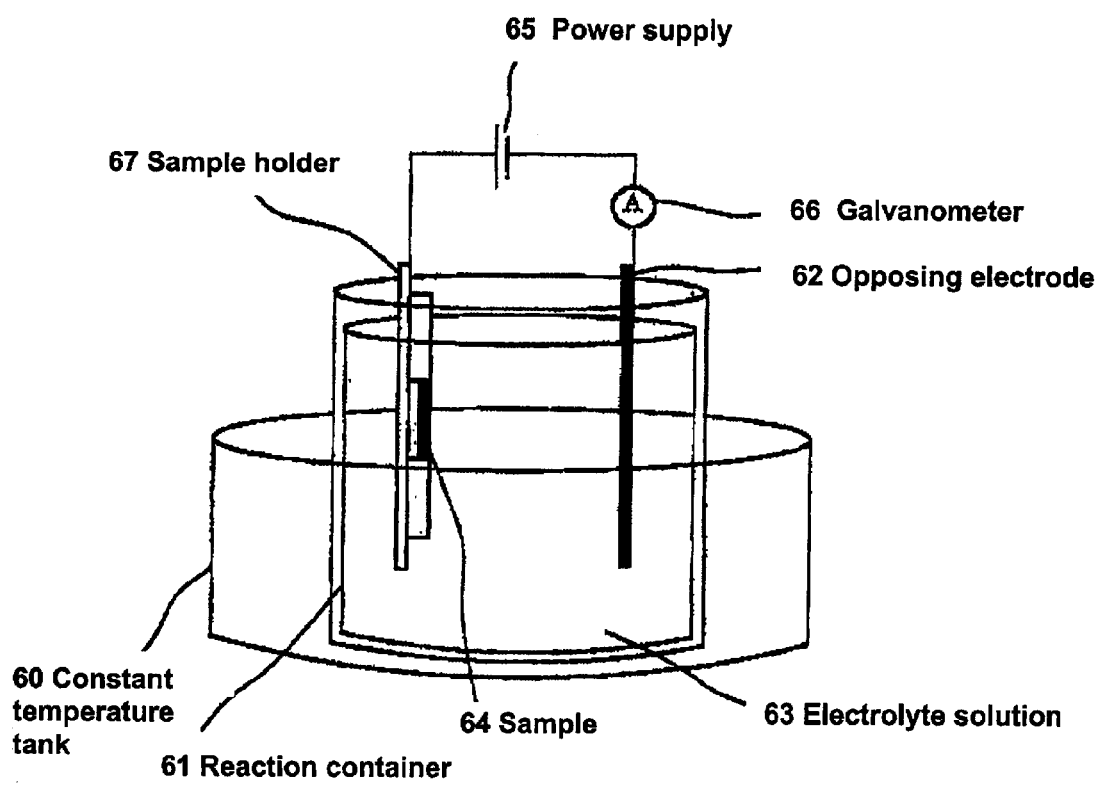
FIG. 6 schematically shows an anodic oxidation apparatus in accordance with an embodiment of the present invention.

Referring to FIGS. 5 and 6, a method for manufacturing structures having pores is described.

FIGS. 5(A)–5(C) schematically show an example of a process used in the present invention, and FIG. 6 schematically shows an example of an anodic oxidation apparatus that may be used in the present invention.

FIG. 5(A) shows a cross section of a film composition before the anodic oxidation process is conducted. Step 1 entails preparation of a member 55 consisting of a first layer 52 containing aluminum, a second layer 51 containing at least Ti, Zr, Hf, Nb, Ta, Mo, W or Si, and a third layer 12 that has electrical conductivity in that order. In FIG. 5(A), the member 55 is formed on a substrate 11, but the substrate is not essential and may be provided depending on the requirements.

Next, as shown in FIG. 5(B), step 2 entails anodically oxidizing the first and second layers to form pores. In this figure, reference numeral 15 denotes an anodically oxidized film formed as a result of anodically oxidizing the aluminum containing first layer 52. Moreover, an oxidized film 53 is formed when the second layer 51 is treated under the anodic oxidation process. Also, depending on the material used and the conditions of the anodic oxidation, there are occasions when the oxidized film 53 remains, or does not remain as residual. FIG. 5(B) shows the case where the oxidized film remains. When the oxidized film 53 remains, it is recommended that the film be removed (step 3) through an etching process. Moreover, step 3 is not an essential step and may be conduced only when necessary.

FIG. 5(C) shows a structure where the above oxidized film 53 does not remain or has been removed through the etching process explained above. The etching process explained above refers to a wet etching process using acid solution or alkali solution.

Also, it is effective if an annealing process is performed before or after the etching. The annealing process can be performed, for example, within a range of 100 to 1,200° C. Residual moisture on the film can be removed with an annealing process of 100° C. or more, and the crystallinity of the anodically oxidized aluminum film can be enhanced with an even higher annealing temperature. The annealing process can be performed in a reducing atmosphere such as a vacuum, or in an environment of hydrogen or inactive gas. It is noted that annealing is also possible in an atmospheric or oxygen environment if the electrically conductive third layer 12 will not be destroyed. After the structure having pores is created the surface can be ground, polished or polished by chemical mechanical polishing (CMP).

In the present embodiment, the diameter of the first pore of the first layer 52 and the second pore of the second layer 51 that are formed and connected may be the same or may be different from one another.

The second layer 51 described above is a semiconductor, metal or metal alloy that contains at least one of Ti, Zr, Hf, Nb, Ta, Mo, W and Si.

The third layer 12 described above is an alloy or a semiconductor material that contains Cu, precious metal, a Cu-containing alloy or precious metal-containing alloy. The precious metal or semiconductor material to be used will be the same material described in the first embodiment described above. The second layer may preferably be thinner than the third layer. Preferably, the thickness of the second layer may be between 1 nm to 50 nm.

For example, while the melting point for Al is 660° C., it must be mentioned that it was not possible to heat-treat the nano holes created in the surface at a temperature higher than the above temperature. In that context, it is hoped that there is a technology for forming anodically oxidized alumina nano holes on a high melting point substrate so that the nano holes can be used in various ways as functional material.

Also, when considering that anodically oxidized alumina nano holes can be applied as electronic devices, a technology to fill nano holes with a filler material and form anodically oxidized alumina nano holes in which the base can be electrically connected to the filler material is desired. If it is possible to form uniform and stable anodically oxidized alumina nano holes over the base of an excellent electrically conductive material such as metal, it will enable forming a filler material in the anodically oxidized alumina nano holes with controlled electrodeposition and hopefully expand the application area of the nano holes.

Moreover, in this embodiment, the porous layer can be formed over support material other than aluminum.

The anodically oxidized alumina nano holes in this embodiment are formed by anodically oxidizing the film containing Al as the main ingredient, oxidizing the entire thickness of the film from the surface of the film to the surface of the third layer, terminating the anodic oxidation at an appropriate time and conducting an etching process depending on the requirements.

As a result, the bottom section of the nano hole is perforated to the surface of the conductive metal base layer. The nano hole is characterized by excellent linearity to the base section. Also, the inventors of the present invention discovered that, by creating an appropriate bonding layer in an interface between the surfaces of the anodically oxidized alumina nano hole layer and the conductive metal base layer in the perforated section at the bottom of the nano hole, the bonding strength and adherence of the anodically oxidized alumina nano hole layer and the conductive metal base layer will increase.

In a conventional technology, an anodically oxidized alumina hole can be formed over a support material made of material other than aluminum. This technology conducts a process including the steps of forming an Al film on a Si substrate, removing a barrier layer on the bottom section of the nano hole after changing the Al film into an anodically oxidized film, forming a metal layer (Au, Pt, Pd, Ni, Ag, Cu) on the Si substrate exposed within the nano hole, and growing Si needle crystals with a Vapor Liquid Solid (VLS) method.

In this technology, there is a process to remove the barrier layer at the bottom of the nano hole after the Al film is subject to anodic oxidation in order to have the nano hole pierced to the surface of the Si substrate. Some of the methods used to remove the barrier layer include one that uses chromic acid etching solution and another that allows (the Si substrate) to be immersed in the solution after using an external conductive wire to connect the opposing electrodes with the substrate after the anodic oxidation process is terminated. FIG. 2(A) shows a cross section of a structure after the anodic oxidation is completed, leaving the barrier layer 122 remaining. FIG. 2(B) shows a cross section of a structure that has the barrier layer 122 removed through the dry etching method. The reference numeral 114 denotes the nano hole, 115 the anodically oxidized film, 125 the section where the barrier layer has been removed, and 123 the substrate.

However, when the inventors of the present invention studied this conventional method, it revealed that the removal of the barrier layer after the anodic oxidation process poses some problems. As shown in FIG. 2(B), the nano hole diameter at the section where the barrier layer had been removed disrupts the linearity in that specific area, or it becomes discontinuous or the shape of the nano hole becomes uneven. In this embodiment, there is no need to remove the barrier layer because a nano hole that penetrates the alumina layer can be formed. Moreover, in this embodiment, pores with excellent linearity and uniform diameter can be formed because the pores are formed through anodic oxidation process up to the depth corresponding to the film thickness of the first layer (for example an aluminum film).

The following is a more specific explanation of the above process.

(a) Step 1: Film Forming Process (FIG. 5(A))

A sample is produced by successively forming on a substrate 11 a third layer 12 with electrically conductive properties, a second layer 51 and a first layer 52 in that order. Any film forming method may be used for forming these film layers such as resistance heating vapor deposition method, EB vapor deposition method, sputtering method and CVD.

Also, the aforementioned materials in the first embodiment can be used in the substrate 11 and third layer 12. The first layer 52, for example, is the layer that includes aluminum in the composition ingredients. It is noted that the parts material includes aluminum as the main composition ingredient, but may also include other ingredients. Main ingredient means the main composition elements in the parts material. For example, if analyzed with ICP, the main ingredient would have an atomic weight ratio of more than 20% against the parts material.

Also, the second layer 51, for example, is a layer that contains at least one of the following ingredients, Ti, Zr, Hf, Nb, Ta, Mo, W or Si. The material may either be metal, semiconductor or alloy.

While the thickness for the second layer 51 is not limited, the thickness may preferably be between 1 nm and 100 nm, and more preferably between 1 nm and 50 nm. Also it is preferable that the thickness of the aforementioned second layer be thinner than that of the third layer. More preferably, the thickness of the second layer may be thinner than half the thickness of the third layer. Also, the thickness of the second layer may be thinner than the thickness of the first and third layers.

(b) Step 2: Anodic Oxidation Process

The structure mentioned in the present invention is created by subjecting the above sample to an anodic oxidation process. FIG. 6 schematically shows an example of an anodic oxidation apparatus used in this process. The apparatus shown in FIG. 6 has a constant temperature tank 60, a reaction container 61, an opposing electrode 62 such as a Pt plate, an electrolyte solution 63, the sample 64, a power supply 65 for applying the anodic oxidation voltage, a galvanometer 66 for measuring the anodic oxidation current and a sample holder 67. While not shown in the drawing, a computer may preferably be included in the system to automatically control and measure voltage and current.

The sample 64 and the opposing electrode 62 are placed within the electrolyte solution whose temperature is maintained at a set level by the constant temperature tank. The anodic oxidation process is performed by applying voltage between the opposing electrode 62 and the sample 64 from the power supply 65. Here, the sample holder 67 is designed to keep the voltage away from unnecessary parts.

Some of the electrolytes that might be used in the anodic oxidation process are oxalic acid, phosphoric acid, sulfuric acid and chromic acid solutions. A preferred solution is sulfuric acid for low voltage (about 30V or lower) application and phosphoric acid for high voltage (60V or higher) application. Oxalic acid is preferred for voltages in between.

Also, if such alcohol as ethanol or isopropyl alcohol of 3% or more is mixed in the electrolyte solution, the anodic oxidation process is apt to stabilize even if oxygen bubbles form if there are pin holes in the Al layer and causes electrical decomposition of water when the electrolyte solution comes in contact with conductive metal base layer because alcohol facilitates the break up of bubbles.

Figure 7:
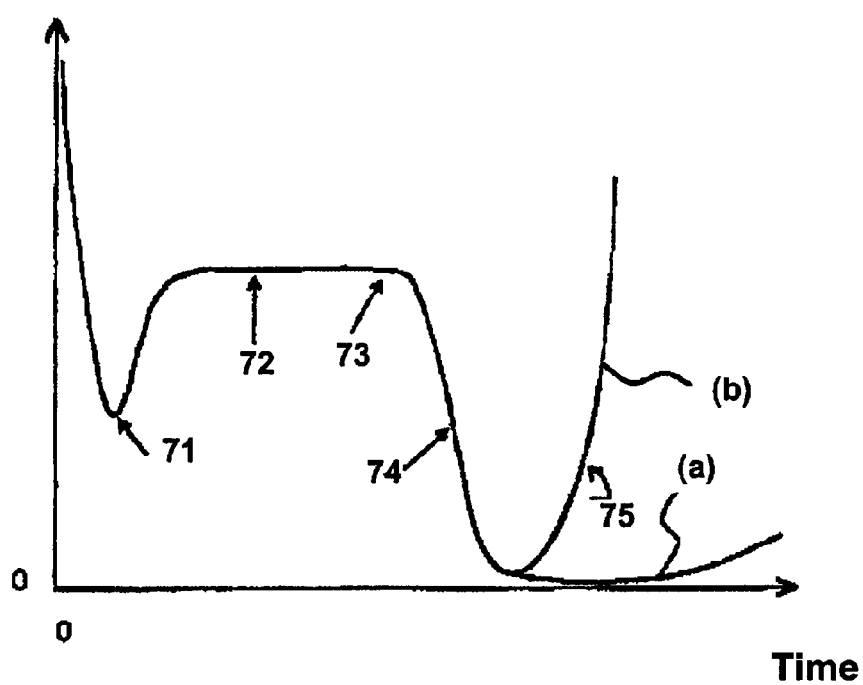
FIG. 7 shows a graph showing the electric current profile at the time of anodic oxidation.

The following is a detailed explanation of anodic oxidation process. FIG. 7 shows the electric current profile when various base layers (that is the third layer 12 in FIG. 5(A)) are used in anodic oxidation.

In this case, when a film of the base layer is formed on such a substrate as a quartz, an electrode is created from the third layer 12 after an Al film 52 is subsequently formed, and anodic oxidation is performed at a set voltage within an electrolyte solution such as oxalic acid, the surface of Al is initially oxidized, causing the current value to rapidly decline (at point 71 in FIG. 7). But as the nano holes begin to form, the current gradually increases to a certain level (point 72 in FIG. 7). To accurately measure the oxidation current at this juncture, it is necessary to prevent the base layer from coming in contact with the electrolyte solution.

When the anodic oxidation reaches the third layer 12 (point 73 in FIG. 7) the current value declines (point 74 in FIG. 7) as the oxidation of Al and the diffusion of Al ions within the electrolyte are restrained, although it depends on the formation of the aforementioned base layer. However, if anodic oxidation is continued at this rate, the third layer 12 will come in contact with the water solution and in some case cause the current value to increase (point 75 in FIG. 7) as water begins to electrically decompose. If this electrical decomposition occurs, the nano holes will gradually be destroyed. Therefore, when the anodic oxidation is terminated when it reaches the third layer 12, particularly when a current decline of 5% or more is seen, it is possible to penetrate the bottom of the nano holes. If there is a stable amount of oxide (such as oxide of Cu) in the material of the third layer, there will be a sufficient amount of current decline ((a) in FIG. 7), but the current decline will be small ((b) in FIG. 7) if the oxide is oxide of Pt or others.

In this embodiment, the electrode is created from the electrically conductive third layer, which is processed with anodic oxidation. Pores reaching the surface of the third layer can be formed by terminating the anodic oxidation process by controlling the oxidation conditions while monitoring the current change of the anodic oxidation.

A stable current declining zone can be obtained after the conclusion of anodic oxidation of Al, as indicated at (a) in FIG. 7, if the anodic oxidation is performed by sandwiching metals, alloys or semiconductors containing such elements as Ti, Zr, Hf, Nb, Ta, Mo, W, S, or Si in a boundary layer (that is the second layer 51 of FIG. 5(A)) between film Al and the third layer 12. This is presumably because the anodic oxidation and the dissolution of the bonding layer itself progresses gradually. While the film thickness of the bonding layer is not limited, it may preferably be between about 1 nm and 50 nm.

When this bonding layer is anodically oxidized, the oxides of the metal layer for the bonding layer might remain as residue in the bottom section of the nano hole. It is preferred that etching process be used to remove the residues and expose the surface of the aforementioned base layer. For this etching, acid solution such as phosphoric acid or sulfuric acid may preferably be used or alkali solution as KOH and NaOH be used.

While it depends on the formation of the bonding layer or its thickness, it is possible to create linear nano holes from the surface of the anodically oxidized film 15 to the base layer 12 through the etching process as shown in FIG. 3(B), as well as create a structure in which the hole diameter at the bonding layer portion is slightly smaller than the nano hole diameter as shown in FIG. 4(A), or a structure in which the hole diameter at the bonding layer portion is slightly larger than the nano hole diameter as shown in FIG. 4(B).

However, the current change mentioned above cannot be accurately detected unless the anodic oxidation of Al film 52 is made to progress uniformly. That is, if there is some defective portion like pinholes, the current could increase when the anodic oxidation process is terminated. In order to assure uniform anodic oxidation, it is effective to make the anodic oxidation area smaller than the container and holder used for anodic oxidation. Moreover, it is more effective to anodically oxidize the sample in a vertical position than in a horizontal position. Also, it is effective to make the opposed electrode adequately large compared with the anodically oxidized area. When the oxidation reaches the metal layer (such as Pt), which is difficult to oxidize, the electric decomposition of water in the electrolyte starts, possibly creating bubbles that destroy the anodic oxide film. Therefore, the anodic oxidation process may preferably be stopped immediately before the oxidation reaches the metal layer.

In the anodic oxidation process of this invention, the entire film thickness of the first layer 52 will be oxidized. When the anodic oxidation progresses from the Al surface and reaches the electrically conductive third layer 12, a change in the anodic oxidation current can be seen. Because of this, one may conclude that the anodic oxidation processes had ended when the current change is detected. For example, one can make the judgment to end the application of anodic oxidation voltage when the oxidation current declines. This method can be used to prevent excessive anodic oxidation. However, it is necessary for the anodic oxidation of Al to progress uniformly in order to detect this current change.

Figure 8:
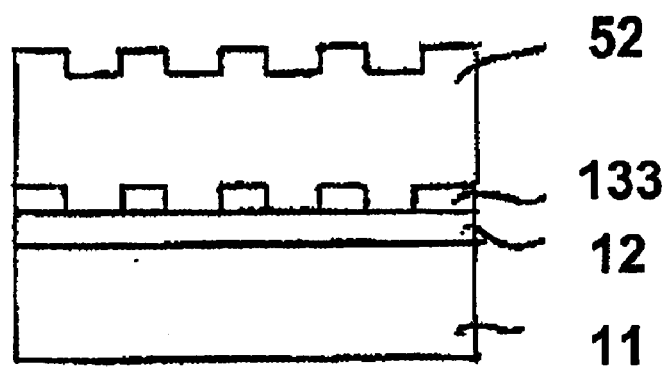
FIG. 8 schematically shows part of a process of manufacturing a structure having pores in accordance with an embodiment of the present invention.

Also, a process to form an uneven surface on the surface of the first layer (an aluminum film, for example) may preferably be conducted before performing the anodic oxidation process. In this case there is an inclination of voltage to concentrate on dented sections of the rugged surface. Therefore, the pores will be formed by using the dented sections as the starting points. The forming of uneven surface can be achieved by directly pressing a material with uneven surface on the aluminum film. Alternatively, an uneven surface can be created by forming an aluminum film on material with uneven surface. For example, as shown in FIG. 8, an uneven surface may be formed by patterning the second layer (bonding layer) in advance, and then the first layer (an aluminum film, for example) may be formed over it. In the figure, reference numeral 52 denotes the aluminum film, reference numeral 133 denotes the second layer patterned for forming the uneven surface. In this case it is not necessary to perform anodic oxidation process on the second layer. Electron beam exposure, interference exposure or convergence ion beam sputtering can be used for the patterning step. Also, in order to create the starting points for the pores, the anodic oxidation process may preferably be performed after the aluminum film surface is exposed to particle beam (for example, charged particle beam, convergence ion beam and electron beam etc.) In this case, known particle beam irradiation may be used.

(c) Step 3: Etching Process

As described above, there are occasions when oxidized film 53 remains as residual when the second layer is anodically oxidized. In this case, the etching process shall be used. By applying the etching process on the above structure having pores, it is possible to remove the non-penetrated portion from the oxidized film 53 at the bottom of the nano holes. For this treatment there is a process for immersing the structure in an acid solution (phosphorous acid solution, for example) or in alkali solution (KOH solution etc.) It is noted that, if tungsten (W) is used for the second layer 13, alkali solution may preferably be used. Moreover, with this etching process, the nano hole diameter can also be expanded at the same time. It is possible to create a nano structure with the desired nano hole diameter in accordance with the acid density, processing time and temperature. Also, this step 3 can be omitted if there is no residual of oxidized film 53. FIG. 5(C) shows a cross section wherein the oxidized film 53 has been dissolved while expanding the diameter of the nano hole.

As shown in FIG. 3(A), alumina nano holes have many cylindrical nano holes using Al and oxygen as the main ingredients. The nano hole 14 is formed virtually vertically on the surface of the electrically conductive third layer. And, the respective nano holes are aligned mutually parallel and approximately at equal interval. Also, the respective nano holes, as shown in FIG. 3(A), tend to align themselves in a triangle grid shape. Nano hole diameter 2r can be set within a range of 0.1 nm to 500 nm. For example, it is possible to set the nano hole diameter 2r at several nm to several 100 nm, and its interval 2R at several 10 nm to several 100 nm. The interval and diameter of nano holes can be controlled with the density and temperature of the electrolyte used in anodic oxidation, the method of applying anodic oxidation voltage, voltage value, time and subsequently by various processing conditions including pore widening processing condition.

The thickness of the alumina nano hole layer can be controlled by the thickness of the first layer (the film using Al as the main ingredient.) The thickness is between 10 nm to 100 micrometer, for example. Conventionally, the depth of nano hole was generally controlled by the processing time of anodic oxidation. But in this embodiment, the depth can be regulated by the thickness of the film that uses Al as the main ingredient. Therefore, alumina nano holes with a uniform nano hole depth can created.

(Third Embodiment: Fillers in the Pores)

In accordance with the third embodiment, an explanation will be given for filling materials within the holes of the structure having pores obtained through the first and second embodiment described above. Specifically, this entails filling metal or semiconductor in pores in a structure having pores with the electrodeposition method. In accordance with the present embodiment, an excellent control of electrodeposition can be attained because there is an electrically conductive third layer 12 at the bottom of the pores. As filler materials, Co, Cu and Ni may be used. When these elements are used, it is necessary to apply a negative voltage to the third layer 12 because these elements are in the form of positive ions within the electrodeposition solution.

In this embodiment, the forming of fillers through electrical migration shall be called electrodeposition. For example, as DNA has a negative charge in aqueous solutions, it is possible to fill DNA into the pores by applying positive voltage in the third layer similar to the description above.

It is noted that, instead of electrodeposition, permeation from above the pores and membrane forming methods like CVD can be also used. Moreover, in electrodeposition, semiconductors and oxides in addition to metal can be used as the filler.

Figure 9:
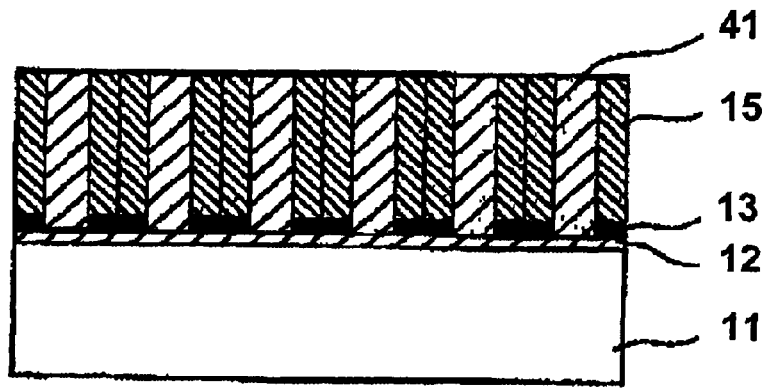
FIGS. 9(A)–9(D) schematically show examples in which structures having porous are filled with materials in accordance with embodiments of the present invention.
Figure 9:
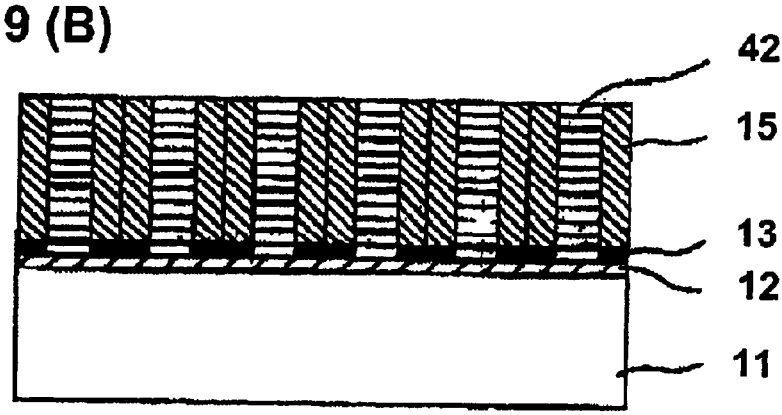
Figure 9:
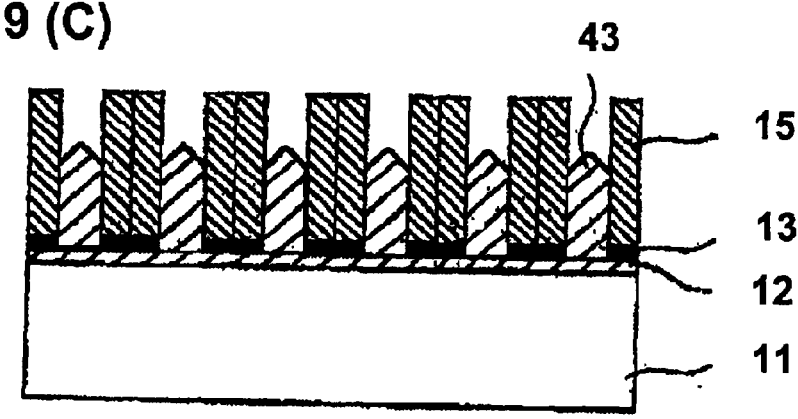
Figure 9:
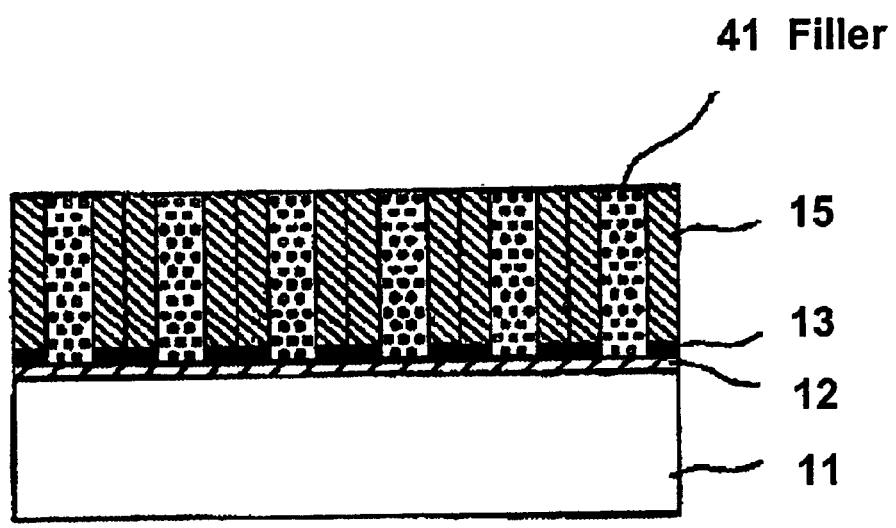

As structures filled with materials in the pores, there are those in which filler 41 is filled uniformly to the surface of the poles, as shown in FIG. 9(A), those in which pores are filled with stacked layered film 42, as shown in FIG. 9(B), or those in which material 43 is filled half way up the pores, as shown in FIG. 9(C). Moreover, while not depicted in the drawing, there are structures where the fillers that grow from within to outside of the pores.

In the event the filler is a magnetic substance, the structure can be used as an effective magnetic media as a vertical magnetic film, or as an effective quantum effect device if used as a magnetic thin wire. Also, if Co and Cu are electrodeposited in laminated order within the nano holes as shown in FIG. 9(B), it is possible to create a GMR device that responds to magnetic fields.

If the structure is designed to accept fillers halfway in the pores, as shown in FIG. 9(C), it is possible to create electron discharging devices and displays using such a device.

Also, if the filler material is a light emitting or luminous substance, it can be used as a light emitting device as well as a wavelength converting layer. A photonic device can be created even if an electrically conductive substance other than alumina is used. In this manner, various types of devices can be made by filling the structure having pores with various materials.

In the present invention, the filler may be something within the anodically oxidized nano holes as well as a filler substance that stretches out from the interior of the hole. FIG. 9(D) shows a cross section of a structure having pores shown in FIG. 5(C) explained above in the second embodiment, and using filler 41 to fill the pores with metal or semiconductor.

When electrodepositing metal in the pores explained above, a porous substrate may merely immersed in a solution of electrodeposited metal ions, and a negative voltage may be applied on the conductive third layer. An aqueous solution of cobalt sulfate can be used for this solution. Also, it is effective to apply alternating current voltage to take adequate measures to trigger nucleus generating during electrodeposition.

In this manner, the invention may be applied to new electronic devices by filling the structures having pores with metal, semiconductor or oxides. Devices may include quantum thin wires, MIM devices, electro-chemical sensors, coloring, magnetic recording media, EL light emitting devices, electro-chromic devices, optical devices, wear-resistant and insulation-resistant membranes and filters.

Moreover, it is possible to grind and polish the surface of the structure with pores to planarize its surface later after performing adequate electrodeposition within the pores.

Moreover, it is also effective to perform annealing before and after an etching process. It is possible to perform annealing at temperatures up to 1200° C. It is possible to remove residual moisture on the film with annealing of more than 100° C., or enhance the crystallinity of anodically oxidized aluminum film at a higher temperature. Also, if annealing is performed after the pores have been filled, this will have the effect of controlling the characteristics of the filler and the structure or enhance the adhesive strength. The above annealing process is not only possible in such reducing environment as vacuum, hydrogen or inactive gas, but also in atmospheric or oxygen condition if the electrically conductive metal base layer will not be destroyed.

EMBODIMENT EXAMPLES

Concrete examples of the present invention will be explained by the following embodiment examples.

Embodiment Example 1

This embodiment example explains the results of creating anodically oxidized alumina nano holes using various types of metal layers for bonding layers.

a) Forming of Electrically Conductive Metal Base Layer, Metal Layer for Bonding Layer, Al Film:

Eight types of samples with different metal layers for bonding layers are prepared. That is, after forming a 5 nm thick Ti film on a quartz substrate by using a RF sputtering method, a 20 nm thick Cu film was formed as an electrically conductive metal base layer. Then, after forming a 5 nm thick film of Ti, Zr, Hf, Nb, Ta, Mo, W and Si as the metal layer for the bonding layer, an Al film 500 nm thick was formed.

b) Anodic Oxidation

An anodic oxidation apparatus shown in FIG. 6 is used to perform the anodic oxidation process. In this embodiment example, a 0.3M oxalic aqueous solution was used as the electrolyte with the solution maintained at 17° C. with a constant temperature water tank. The anodic oxidation voltage used here was DC40V, and the electrode was created from the electrically conductive metal base layer side to assure uniform progression of anodic oxidation. In order to detect the current that shows the anodic oxidation has progressed from the Al surface to the conductive metal base layer during the oxidation process, the anodic oxidation current was monitored. The anodic oxidation was terminated only after a current decline of more than 50% from the uniform current value shown in FIG. 9(B) was detected.

After the anodic oxidation process, the device was washed with pure water and isopropyl alcohol.

c) Etching Process

After the anodic oxidation process, the sample was subjected to the etching process by immersing the sample into a 5 wt % phosphoric acid solution for 20 to 45 minutes.

The surface and cross section of the sample extracted was observed with FE-SEM (Field Emission-Scanning Electron Microscope). As a result, the nano holes saw penetration to the electrically conductive metal base layer, as shown in FIG. 3(A). The metal layer for bonding layer remained as residual in oxide form in the anodically oxidized layer of the bottom section between the nano holes and part of the conductive metal base layer.

For comparative example, a comparative sample was made by subjecting an Al film formed on a Si base to anodic oxidation.

When about half of the anodically oxidized layers of the samples of this embodiment example and the comparative example were polished with the same polishing machine using diamond slurry, there was no damage seen in the sample of this embodiment example. However, some damage in the form of pealed anodically oxidized layer was seen in the comparative example. In this manner, it is understood that by creating a bonding layer the bond between the base electrode layer and the anodically oxidized alumina nano hole layer becomes stronger. The bonding layer is useful in the event the device is polished after the creation of nano holes or when stress and other force is applied during the use of the device because this embodiment example has shown that the bonding layer creates a structure with strong bond between the nano hole layer and the bonding layer.

Embodiment Example 2

Samples were prepared in the same way as Embodiment Example 1. However, W was used in the metal layer for the bonding layer, and the thickness of W was changed between 1 and 100 nm. Also, one to 10 minutes of etching was performed using 0.01M KOH solution.

When the prepared samples were observed with FE-SEM, it was learned that when the bonding layer was less than 50 nm, nano holes penetrating up to the base layer of the electrically conductive metal was obtained as shown in FIG. 3(B). But in samples thicker than 50 nm, some nano holes were not completely penetrated. From this it can be deduced that bonding layer between 1 to 50 nm is preferable.

Moreover, in samples where the bonding layer was 5 nm, the linearity of the nano hole under KOH etching was superior when compared with Embodiment Example 1. This is probably because oxides of W are easier to melt with alkali solutions.

Embodiment Example 3

In this embodiment example, anodically oxidized alumina nano holes were created similarly to Embodiment Example 1 and fillers were electrodeposited. However, as electrically conductive metal base layer, a thickness of 20 nm was used with Ag, Pt, Cu and Cr, and a bonding layer with a 2.5 nm thick Ti film was created. The etching was performed with phosphoric acid as in the case of Embodiment Example 1.

After the etching, Co pillars (cylinders) were electrodeposited within the nano holes by electrodepositing Co. The metal plating bath of 5% $CoSO_4$-$7H_2O$ and 2% $H_3BO_3$ was used, and electrodepositing was performed for 20 seconds with a DC voltage of −2V.

When the cross section of the sample electrodeposited was observed with FE-SEM, the shape indicated in FIG. 9(A) was observed. The 60 nm diameter cylindrical shaped nano holes were filled with Co, and aligned parallel and in approximate equal interval of about 100 nm. Also, the pillar diameter was almost uniform to the bottom of the nano holes. However, Pt and Cu were relatively superior in terms of the uniformity of electrodeposited volume.

Embodiment Example 4

In this Embodiment example, nano holes with laminated magnetic substances, like those shown in FIG. 9(B), used as filler, will be explained.

Similarly to Embodiment Example 3, after penetrated nano holes were formed on a Cu base layer, the sample was immersed in a plating bath comprising 0.5M of cobalt sulfate and 0.001M of copper sulfate together with the opposing electrode of white gold. Then, a voltage of −0.56V, −0.12V were applied respectively for 15 seconds and 0.1 seconds alternately on a Ag/AgCl reference electrode to grow a laminated film of Cu/Co on the bottom of the nano holes to create a nano structure shown in FIG. 9(B).

At this point, when a voltage of −0.56V was applied, only Cu whose electrodeposition electric potential is small was electrodeposited. When a voltage of −1.2 V was applied, a highly dense Co was the main filler deposited. As a result it became a laminated layer.

After polishing the surface of the above sample, an electrode was attached to the top section, and when the dependency of magnetic field of the resistance between the upper section of the filler material and the electrically conductive metal base layer was examined, a negative magnetic resistance was observed. It is believed that this was the result of the GMR effect of the laminated films used to fill the holes.

This indicates that the present invention can be used as magnetic sensors.

Embodiment Example 5

Similarly to Embodiment Example 3, anodically oxidized alumina nano holes were created. In this case, a 2.5 nm thickness was used for W in the metal layer for the bonding layer, and 0.01M KOH solution was used for etching. After Co was electrodeposited, the sample was annealed for one hour at a temperature of 400° C. in vacuum. And, when the surface was polished with diamond slurry, the polishing rate declined compared with the pre-annealing stage, and after the polishing was completed, the uneven surface showed some smoothness. This was believed to have been caused by the fact that the anodically oxidized alumina layer was hardened by the annealing process. Similarly, when the annealing was done before the etching process, there was a decline in the etching rate of the alumina nano hole section. This was believed to have been caused by an increase in the chemical durability of the alumina nano hole section due to the annealing process.

From the above, it can be said that, by implementing an appropriate level of annealing process before the etching, the shape of the nano hole at its bottom can be controlled from the one shown in FIG. 3(B) to those shown in FIGS. 4(A) and 4(B).

As explained above, the present invention can provide a novel structure having a characteristic support member that supports an alumina-containing porous layer and its manufacturing method.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A structure having pores, comprising:
   a substrate;
   a first layer containing alumina;
   a second layer that includes at least one of Ti, Zr, Hf, Nb, Ta, Mo, W and Si; and
   a third layer formed on the substrate with electrical conductivity, the second layer being disposed between the first and third layers, wherein the first and second layers have pores.

2. A structure having pores according to claim 1, wherein the first layer is an alumina nano hole layer.

3. A structure having pores according to claim 1, wherein the first layer has a first pore and the second layer has a second pore, the first pore and the second pore being connected with each other.

4. A structure having pores according to claim 3, wherein the first pore and the second pore have different pore diameters.

5. A structure having pores according to claim 1, wherein the second layer comprises an alloy including at least one of Ti, Zr, Hf, Nb, Ta, Mo, W and Si.

6. A structure having pores according to claim 1, wherein the second layer comprises a layer formed by anodically oxidizing an alloy including at least one of Ti, Zr, Hf, Nb, Ta, Mo, W and Si.

7. A structure having pores according to claim 1, wherein the second layer includes an oxide of W.

8. A structure having pores according to claim 1, wherein the second layer has a thickness between about 1 nm and 50 nm.

9. A structure having pores according to claim 1, wherein the third layer is formed from one of Cu, noble metal, an alloy containing Cu, an alloy containing noble metal, and semiconductor material.

10. A structure having pores according to claim 9, wherein the noble metal is one of Ag, Au, Pt, Pd, Ir, Rh, Os and Ru.

11. A structure having pores according to claim 9, wherein the semiconductor material is one of graphite, Si, InP, GaAs, GaN, SiGe, and Ge.

12. A structure having pores according to claim 1, wherein the second layer has a thickness smaller than a thickness of the third layer.

13. A structure having pores according to claim 12, wherein the second layer has a thickness smaller than half a thickness of the third layer.

14. A structure having pores according to claim 1, wherein the second layer has a thickness smaller than a thickness of the first layer and the third layer.

15. A device having a material on part or whole of the pores according to claim 1.

16. A device according to claim 15, wherein the material is one of metal material, semiconductor material, and magnetic material.

17. A device according to claim 15, wherein the material is a body of stacked layers of magnetic material.

18. A structure having pores, comprising:

a first layer containing alumina;

a second layer that includes at least one of Ti, Zr, Hf, Nb, Ta, Mo, W and Si; and a third layer with electrical conductivity, the second layer being disposed between the first and third layers, wherein the first and second layers have pores and the third layer is free of pores.

19. A structure having pores comprising:

a first layer containing alumina;

a second layer that includes at least one of Ti, Zr, Hf, Nb, Ta, Mo, W and Si; and a substrate with electrical conductivity, wherein the second layer is disposed between the first layer and the substrate, and wherein the first and second layers have pores.

* * * * *